United States Patent
Tsai et al.

(10) Patent No.: US 6,819,542 B2
(45) Date of Patent: Nov. 16, 2004

(54) INTERDIGITATED CAPACITOR STRUCTURE FOR AN INTEGRATED CIRCUIT

(75) Inventors: Tse-Lun Tsai, Taipei (TW); Yu-Tai Chia, San Jose, CA (US); JC Guo, Hsinchu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 10/379,121

(22) Filed: Mar. 4, 2003

(65) Prior Publication Data

US 2004/0174655 A1 Sep. 9, 2004

(51) Int. Cl.[7] .................... H01G 4/012; H01G 4/228
(52) U.S. Cl. .................. 361/304; 29/25.42; 361/306.3
(58) Field of Search ................. 29/25.42; 361/303–304, 361/301.1, 301.4, 306.3, 308.1, 309–313; 257/307

(56) References Cited

U.S. PATENT DOCUMENTS

| | | | |
|---|---|---|---|
| 5,208,725 A | | 5/1993 | Akcasu |
| 5,583,359 A | | 12/1996 | Ng et al. |
| 5,939,766 A | * | 8/1999 | Stolmeijer et al. .......... 257/534 |
| 6,297,524 B1 | | 10/2001 | Vathulya et al. |
| 6,383,858 B1 | | 5/2002 | Gupta et al. |
| 6,410,954 B1 | | 6/2002 | Sowlati et al. |
| 6,542,351 B1 | * | 4/2003 | Kwang ........................ 361/303 |

OTHER PUBLICATIONS

Hirad Samavati et al., "Fractal Capacitors," IEEE Journal of Solid State Circuits, vol. 33, No. 12, Dec. 1988, pp. 2035–2041.

Roberto Aparicio et al. "Capacity Limits and Matching Properties of Integrated Capacitors," IEEE Journal of Solid State Circuits, vol. 37, No. 3, Mar. 2002, p. 384–393.

* cited by examiner

*Primary Examiner*—Dean A. Reichard
*Assistant Examiner*—Eric Thomas
(74) *Attorney, Agent, or Firm*—Duane Morris LLP

(57) ABSTRACT

A capacitor has at least two layers of substantially parallel interdigitated strips. The strips of each layer are alternately connected to a first and a second bus. The first and second buses of each layer are interconnected to first and second buses of an adjacent layer. The strips of each layer are approximately perpendicular to strips of an adjacent layer. The capacitor further includes dielectric material between strips of the same and different layers. A method of fabricating the capacitor includes forming at least two layers of substantially parallel interdigitated strips which are alternately connected to first and second buses of each layer. The buses of each layer are connected to the respective buses of an adjacent layer. The strips of one layer are approximately perpendicular to the strips of an adjacent layer. Dielectric material is formed between strips of the same and different layers.

7 Claims, 16 Drawing Sheets

INTERDIGITATED CAPACITOR STRUCTURE FOR AN INTEGRATED CIRCUIT

FIELD OF THE INVENTION

The present invention relates to integrated circuits and more particularly to capacitor structures for an integrated circuit and methods of manufacture therefor.

DESCRIPTION OF RELATED ART

Capacitors are used in integrated circuit designs to achieve different functions such as dynamic random access memories, bypassing, and filters. Conventionally, a capacitor in an integrated circuit is composed of two flat conductive plates, with one on the top of the other, and an intervening layer of dielectric material. One disadvantage of this structure is the relatively large area of the chip which is required to obtain the desired capacitance.

One approach to reducing the required chip area involves stacking several layers of conductive plates, which are alternately connected to form opposite electrodes of the capacitor. However, such structure requires additional processing steps during the integrated circuit fabrication process resulting in an associated increase in the cost of manufacture.

Another approach to reducing the required chip area involves the use of a layer of parallel interdigitated strips as electrodes having a dielectric material therebetween. Such a structure provides higher capacitance value per unit area, as a result of the increased electrode (plate) area afforded by the opposing top bottom and sidewall surfaces.

As illustrated in FIG. 1, prior art interdigitated capacitors have parallel strips 130, 140, 150, 160 in the first layer 100, which are alternately connected to the first bus 110 and second bus 120. Strips 130 and 150 are connected to the first bus 110 with the same polarity. Strips 140 and 160 are connected to the second bus 120 with the opposite polarity to the first bus 110. At least one more layer of the same structure overlies the first layer. FIG. 2 shows the structure in cross section through the strips. As shown in FIG. 3, the first buses 310, 312, 314, and 316 and second buses 320, 322, 324, and 326 of different layers are respectively connected by vias 330 and 340. Dielectric material is filled between strips of the same and different layers.

However, since the interdigitated fingers of each layer are parallel to each other in this structure, any misalignment of strips from one layer to the next, caused, for example, by overall registration errors, will change relative positions between the electrodes. As a result, the overall capacitance of the structure will deviate from the expected value and affect the performance of the integrated circuit. As illustrated in FIG. 4, one disadvantage of prior art interdigitated capacitors is the undesired variance of capacitance caused by misalignment of strips between adjacent layers, such as between 412 and 422, because capacitance varies when the relative position between parallel strips of two adjacent layers changes. It is desirous therefore to reduce variation in capacitance value of such a structure resulting from interlayer misalignment.

SUMMARY OF THE INVENTION

The present invention provides a capacitor structure for an integrated circuit comprising at least two layers of substantially parallel interdigitated strips wherein the strips of each layer are alternately connected to a first bus and a second bus. The first and the second bus of each layer are respectively interconnected to the first and second bus of an adjacent layer. The strips of each layer are oriented approximately perpendicular to the strips of an adjacent layer. The capacitor structure further comprises dielectric material between strips of the same and different layers.

Further, the present invention includes a method of fabricating the capacitor structure. The method comprises forming at least two layers of substantially parallel interdigitated strips which are alternately connected to a first bus and a second bus of each layer. Respectively connecting the first and the second bus of each layer to the first and the second bus of an adjacent layer. Orienting the strips of one layer approximately perpendicular to the strips of an adjacent layer. And, forming dielectric material between strips of the same and different layers.

BRIEF DESCRIPTION OF THE DRAWINGS

A more complete understanding of the present invention can be obtained by reference to the detailed description of embodiments in conjunction with the accompanying drawings, in which.

DETAILED DESCRIPTION OF THE INVENTION

Figure 1:
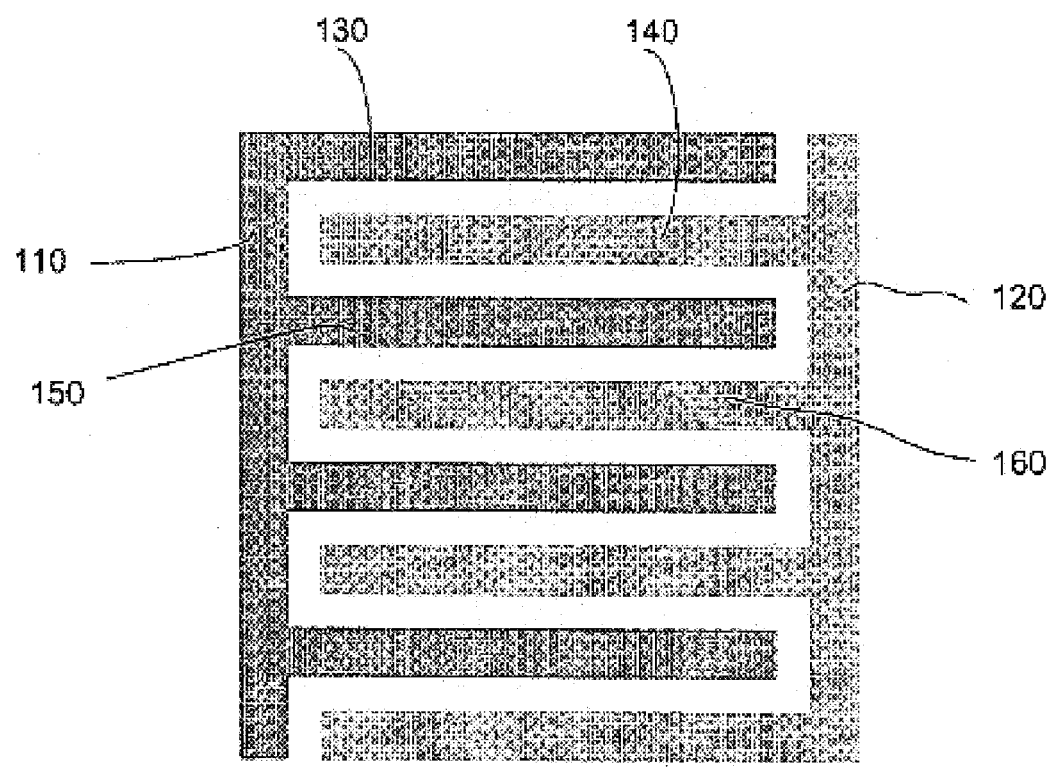
FIG. 1 illustrates a plan view of one layer of an prior art interdigitated capacitor structure.
Figure 2:
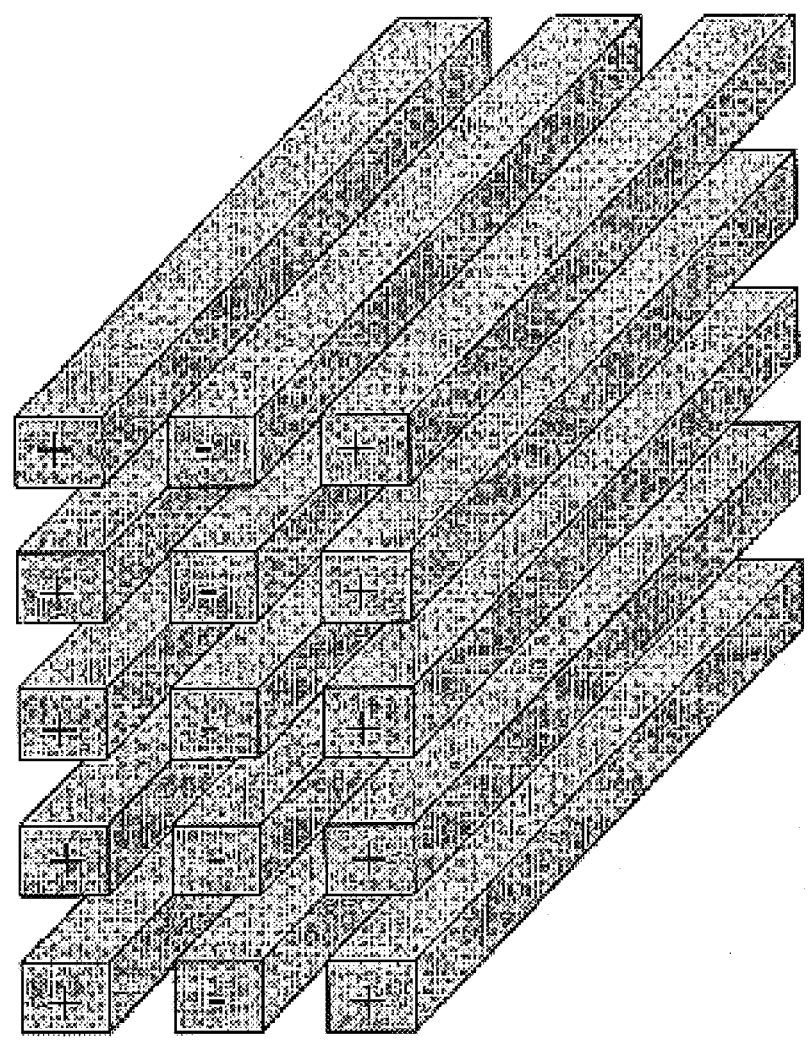
FIG. 2 illustrates a schematic cross-sectional view through strips to show their polarities.
Figure 3:
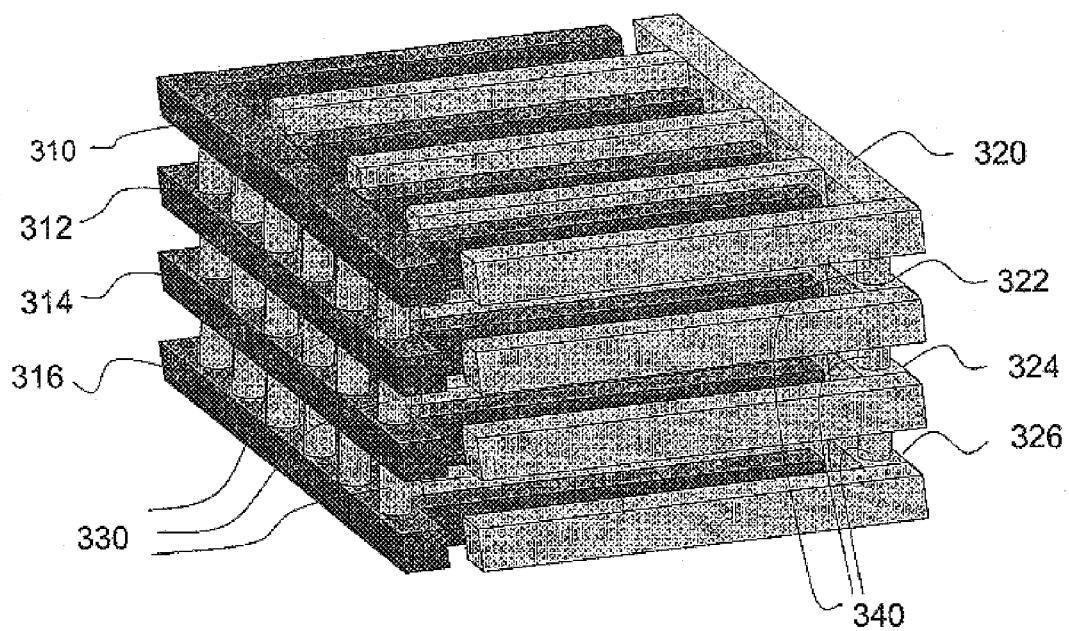
FIG. 3 illustrates the structure of a prior art interdigitated capacitor.
Figure 4:
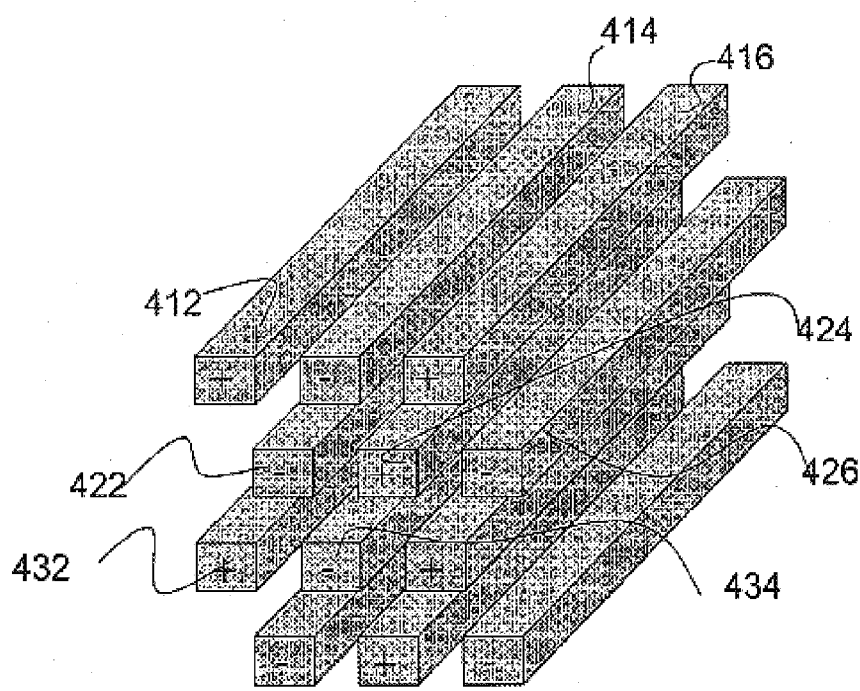
FIG. 4 illustrates a schematic cross-sectional view through strips to show misalignment of strips.
Figure 5A:
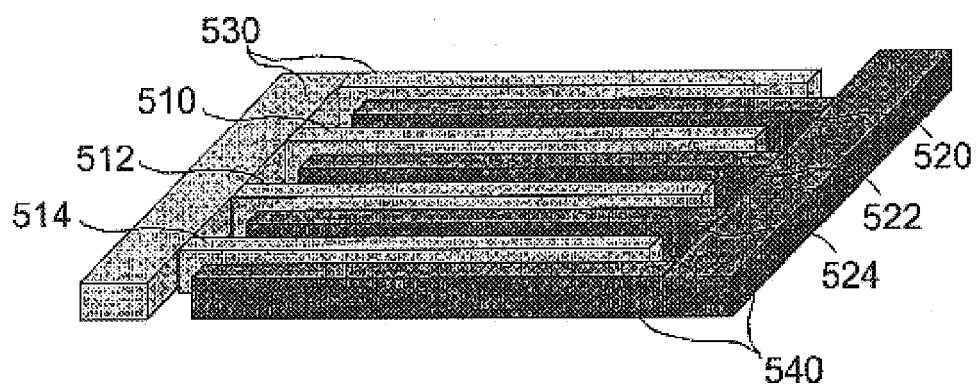
FIGS. 5A and 5B respectively illustrate oblique plan view and top plan view of odd layers of an embodiment of the present invention.
Figure 5B:
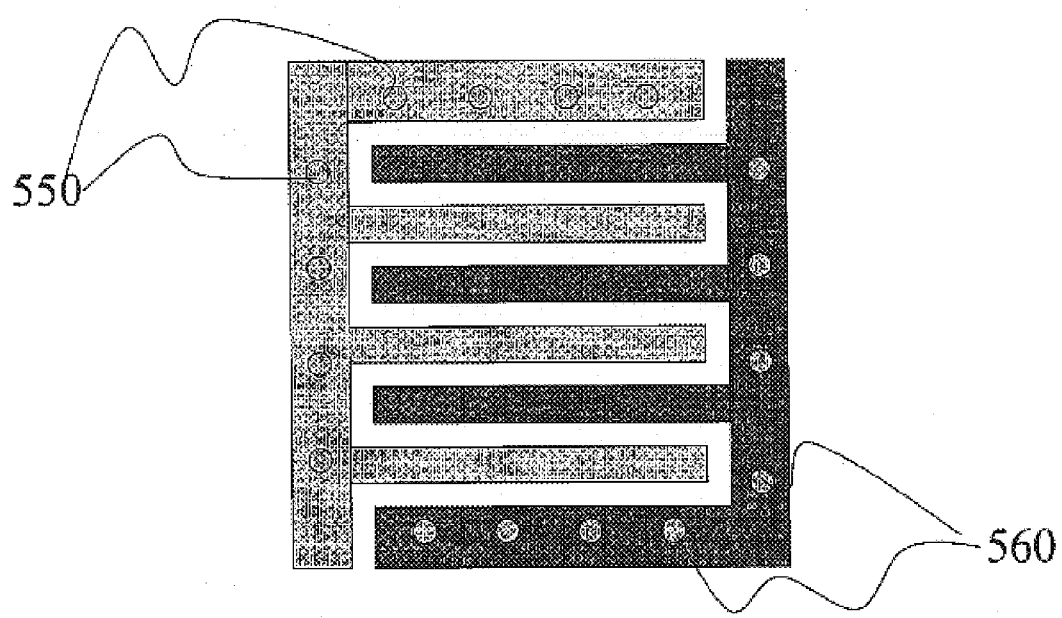
Figure 6A:
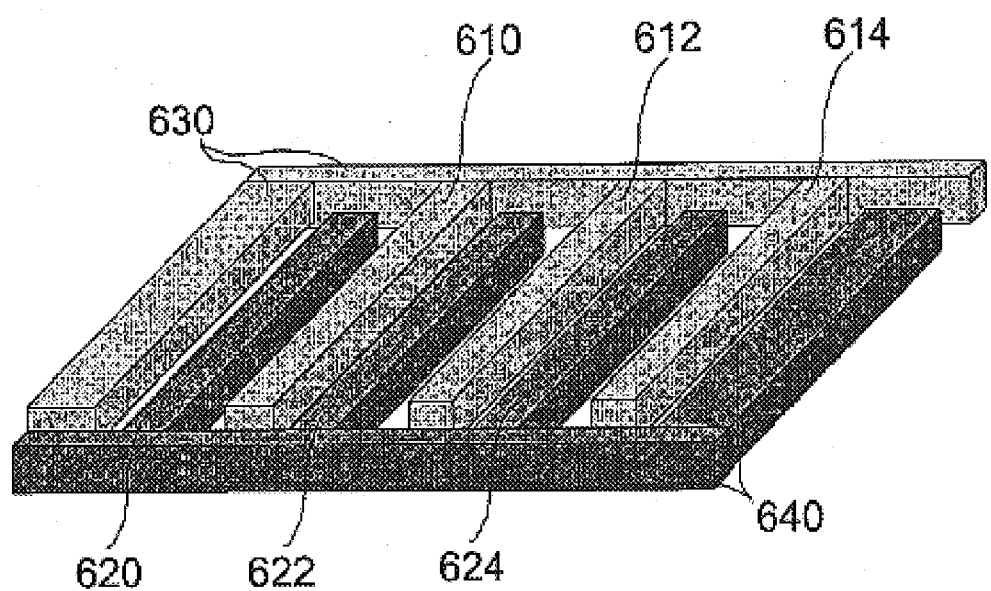
FIGS. 6A and 6B respectively illustrate oblique plan view and top plan view of even layers of an embodiment of the present invention.
Figure 6B:
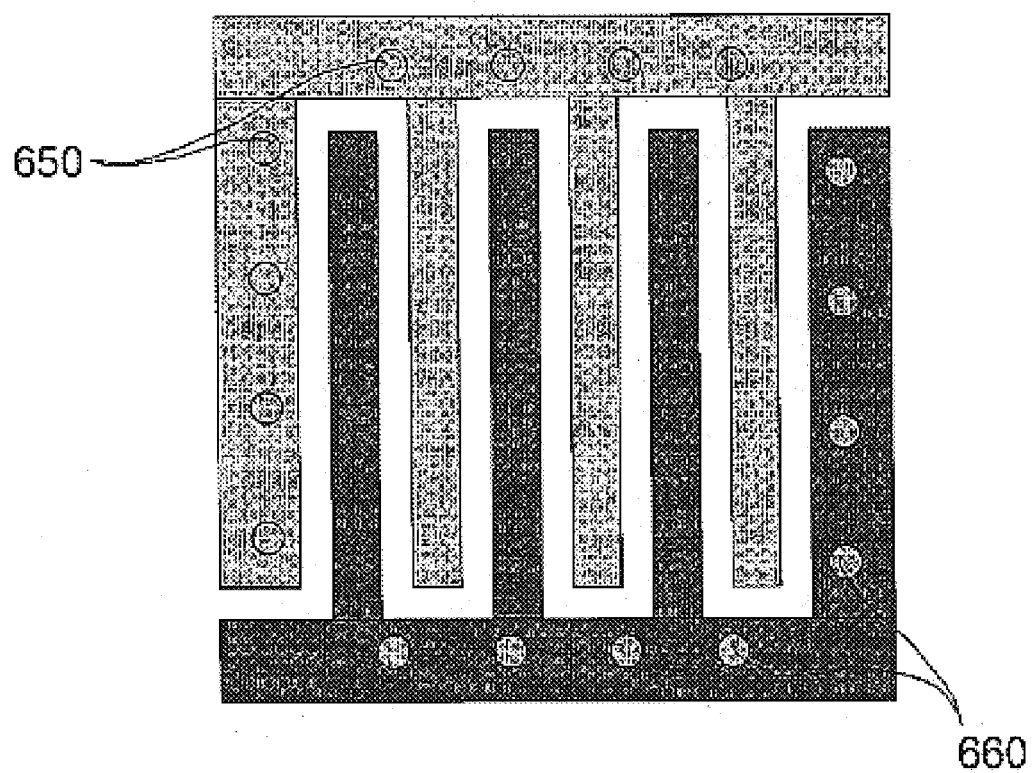

As shown in FIGS. 5A and 5B, a first layer of the interdigitated capacitor comprises substantially parallel strips alternately connected to a first bus and a second bus. The term "strip" or "strips" used in the present invention can be any elongated shape. In some embodiments, buses are wider than strips. Strips 510, 512, and 514 are connected to an L-shaped bus 530 and strips 520, 522, and 524 are connected to the other L-shaped bus 540. A second layer of the interdigitated capacitor, as shown in FIGS. 6A and 6B, also comprises substantially parallel strips alternately connected to a first bus and a second bus. Strips 610, 612, and 614 are connected to an L-shaped bus 630 and strips 620, 622, and 624 are connected to the other L-shaped bus 640. Strips of the second layer are oriented approximately perpendicular to strips of the first layer. Bus 530 of the first layer connects to bus 630 of the second layer through vias 550 and 650. Bus 540 of the first layer connects to bus 640 of the second layer through vias 560 and 660. Dielectric material (not shown) is formed between strips of the same and different layers.

Figure 7:
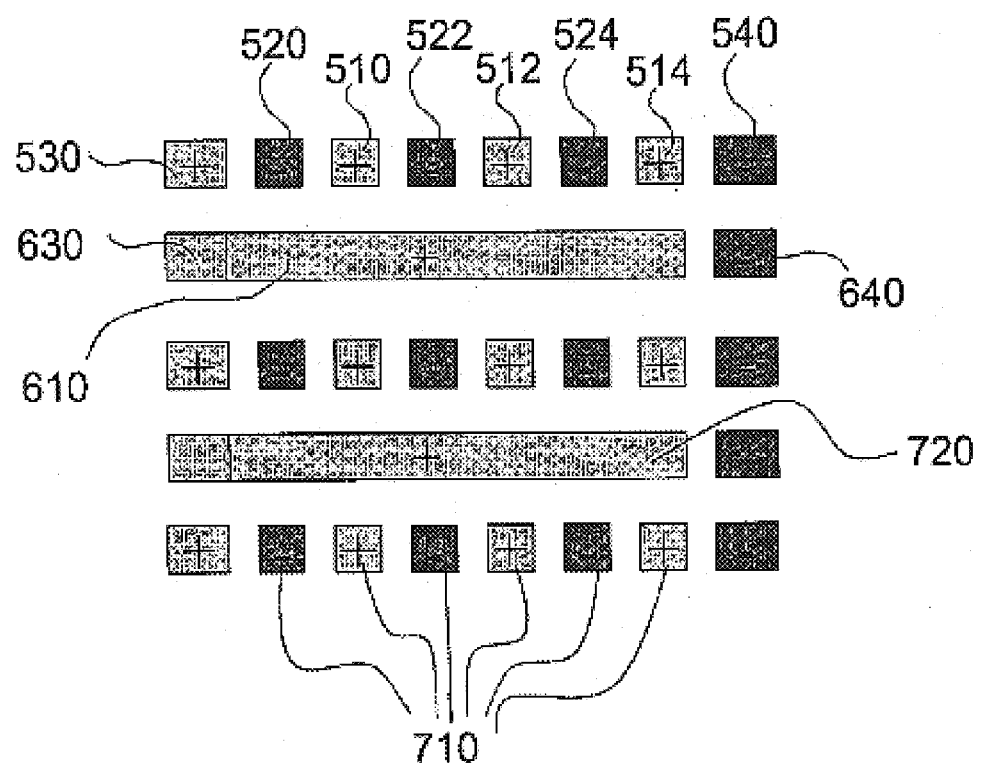
FIG. 7 illustrates a schematic cross-sectional view through strips of five layers to show the relative polarities of the present invention.

Strips of a third layer are oriented approximately perpendicular to strips of the second layer. Strips of a forth layer are oriented approximately perpendicular to strips of the third layer. In other words, strips of the first layer and the third layer are oriented substantially the same direction. And strips of the second layer and the forth layer are oriented substantially the same direction. Additional layers can be added to obtain an interdigitated capacitor with a predetermined number of layers as required to obtain a desired capacitance value. As shown in FIG. 7, an embodiment of five layers interdigitated capacitor has strips of one layer oriented approximately perpendicular to strips of the adjacent layer.

Figure 8:
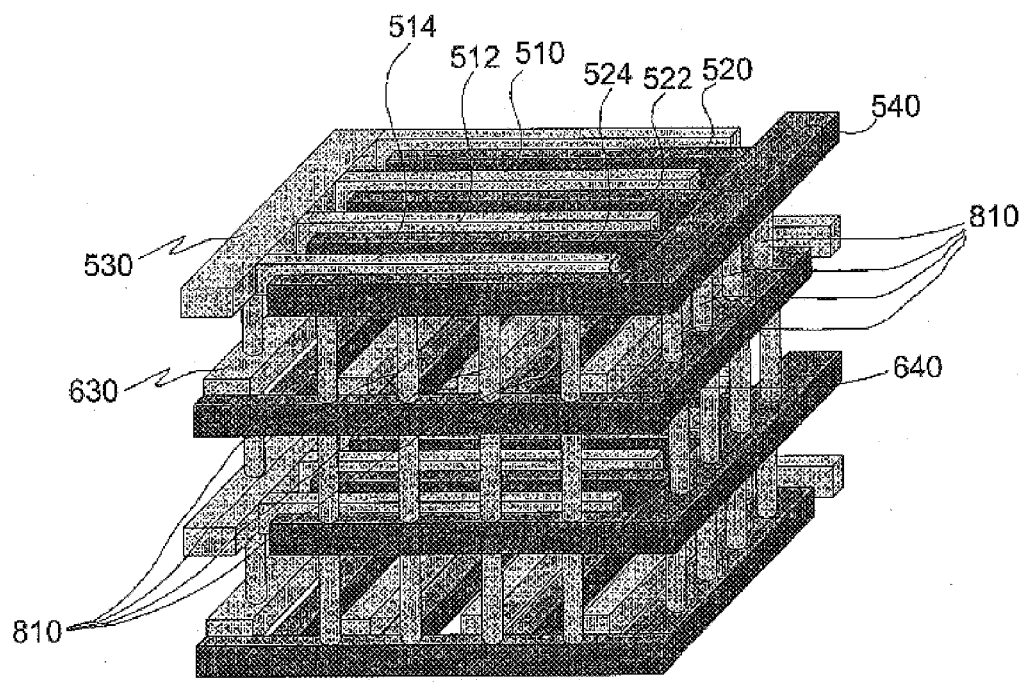
FIG. 8 illustrates the capacitor structure of an embodiment of the present invention.

FIG. 8 illustrates an embodiment comprising four layers of interdigitated strips. Strips of each layer connect to either the first bus or the second bus of its layer. Then the first and second bus of different layers are respectively interconnected to each other through vias. By using buses, complexity of connecting strips of adjacent layers directly to one another can be avoided. In the embodiment depicted in FIG. 8, eight vias 810, four on each leg of the L-shaped second bus are used to interconnect the second buses of two adjacent layers. Likewise, eight vias (not shown), with four on each leg of the L-shaped first bus, are used to interconnect the first buses of two adjacent layers.

As shown in FIG. 8, the first bus and second bus of each layer are L-shaped. In some embodiments, buses are wider than strips in order to accommodate vias. However, other shapes of bus, such as a linear shape, can be used. Also, the shape of the first bus need not be the same as the shape of the second bus. For example, the first bus can be L-shaped while the second bus can have a linear shape.

The interdigitated capacitor of the present invention has at least one via to connect the first bus of two adjacent layers and has at least one via to connect the second bus of two adjacent layers. In the embodiment depicted in FIG. 8, eight vias are used to interconnect each L-shaped bus of each layer to a respective L-shaped bus of an adjacent layer. However, the number of vias used to connect the first bus of two adjacent layers need not be the same as the number of vias used to connect the second bus of two adjacent layers. The number of vias can be proportional to the length of the bus to ensure good interconnection exists between buses of different layers Strips, buses, and vias comprise a conductive material, including but not limited to copper, aluminum, titanium nitride (TiN), doped polysilicon, and any combinations thereof. The composition of one strip may vary from that of another strip, the same for buses and vias. Also, the composition of strips, buses, and vias need not be identical. Dielectric material can be silicon dioxide ($SiO_2$), silicon nitride (SiN), tantalum pentoxide ($Ta_2O_5$), and any combinations thereof. The choice of conductive materials and dielectric materials depends on the manufacturing process and the application of capacitors, and is well known within the skill of the art.

Figure 9:
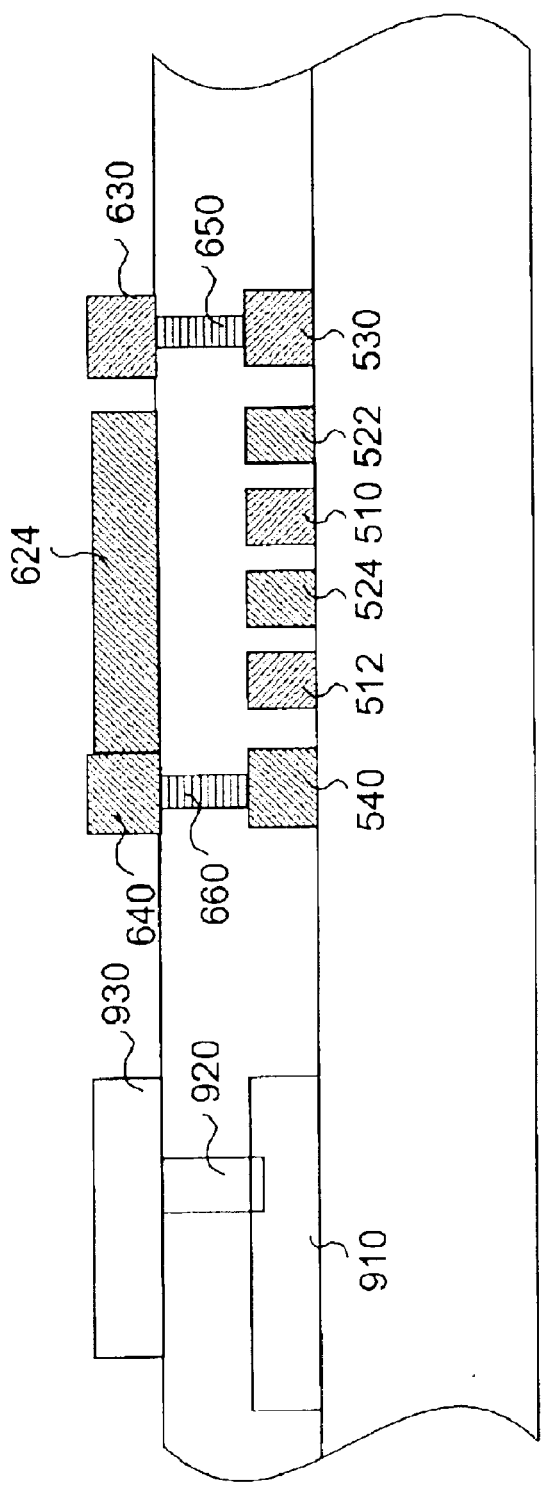
FIG. 9 illustrates a schematic cross-sectional view of an embodiment of the present invention within an integrated circuit.

The interdigitated capacitor of the present invention can be manufactured at the same time as other circuits as illustrated in FIG. 9 without additional processing steps, and therefore no additional cost. Strips of the first layer 510,512, 522, and 524; the first bus of the first layer 530; the second bus of the first layer 540; and a trench 910 of another circuit feature are on the same layer and can be concurrently manufactured at the same time. By the same token, vias 650 and 660, as well as via 920 of the other circuit feature can be concurrently formed at the same time. Strip 624; the first bus of the second layer 630; the second bus of the second layer 640; and a trench 930 of the other circuit feature can be concurrently formed at the same time without extra costs.

Figure 10A:
FIGS. 10A–10G illustrate the steps of forming an interdigitated capacitor within an integrated circuit. The right side of the figures is the interdigitated capacitor and the left side of the figures is other circuit manufacturing on the same semiconductor device.
Figure 10B:
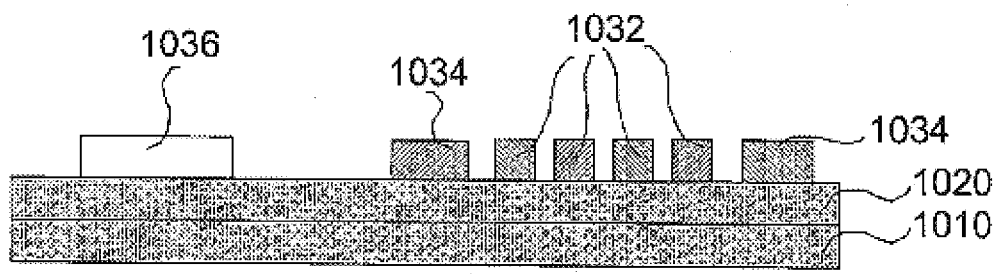
Figure 10C:
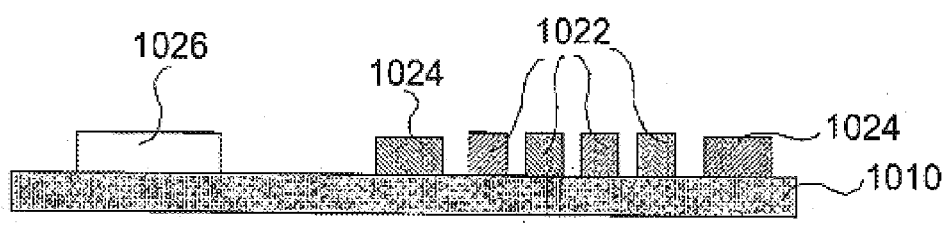

A method of fabricating an interdigitated capacitor structure such as the embodiment shown in FIG. 8, is illustrated in FIGS. 10A through 10G. A metal layer 1020, as illustrated in FIG. 10A, is deposited on an isolation layer 1010 by for example chemical vapor deposition (CVP) or physical vapor deposition (PVD) method. In some embodiments, a layer of antireflective coating may be deposited over the metal layer 1020. A layer of photoresist 1030 is then formed over the metal layer 1020. The photoresist is later exposed through a mask (not shown) with a pattern including strips and other circuit element, for example a trench. The pattern is developed on the photoresist which is then removed except for areas of strips 1032, buses 1034, and trench 1036 as shown in FIG. 10B. The uncovered area of the metal layer is then etched away and the remaining photoresist is removed. Only strips 1022 and buses 1024 of the interdigitated capacitor, and for example a trench 1026 on other features in the metal layer are left, as illustrated in FIG. 10C. Strips 1022 in FIG. 10C are equivalent to strips 710 in FIG. 7.

Figure 10D:
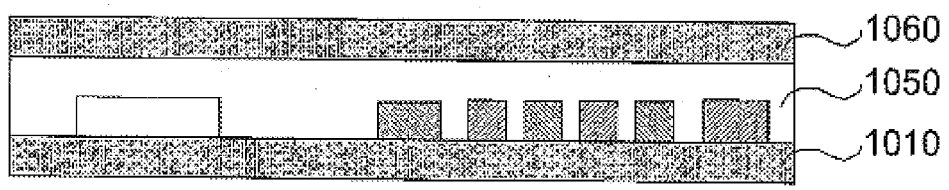
Figure 10E:
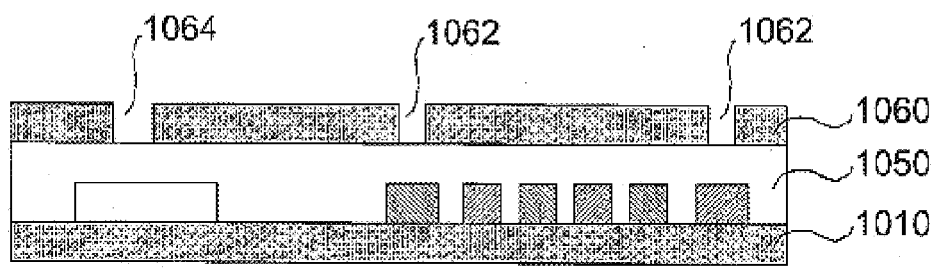
Figure 10F:
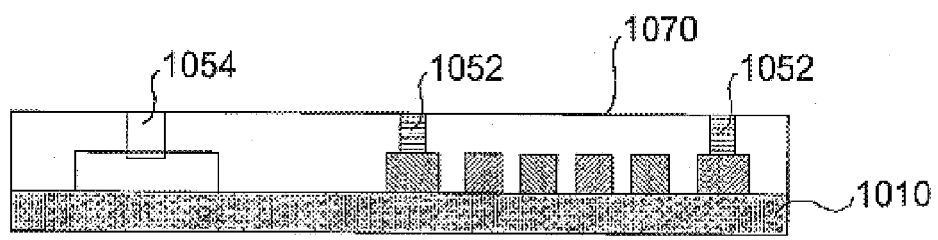

After first layer of strips and buses are formed, a layer of inter metal dielectric (IMD) 1050 is formed between strips and covers all other vacant area as shown in FIG. 10D. The upper surface of the layer of IMD 1050 is then planarized by, for example, chemical mechanical polishing (CMP). Another layer of photoresist 1060 is formed over the dielectric layer 1050. Following an exposure and development process, photoresist on the area where vias are located is removed and holes 1062 and 1064 are left, as shown in FIG. 10E. After etching three holes in the dielectric layer down to at least the surface of the underlying features, conductive material is deposited and via 1052 of interdigitated capacitor and via 1054 of the other circuit element are formed, as shown in FIG. 10F. The surface 1070 is planarized by, for example, chemical mechanical polishing (CMP).

Figure 10G:
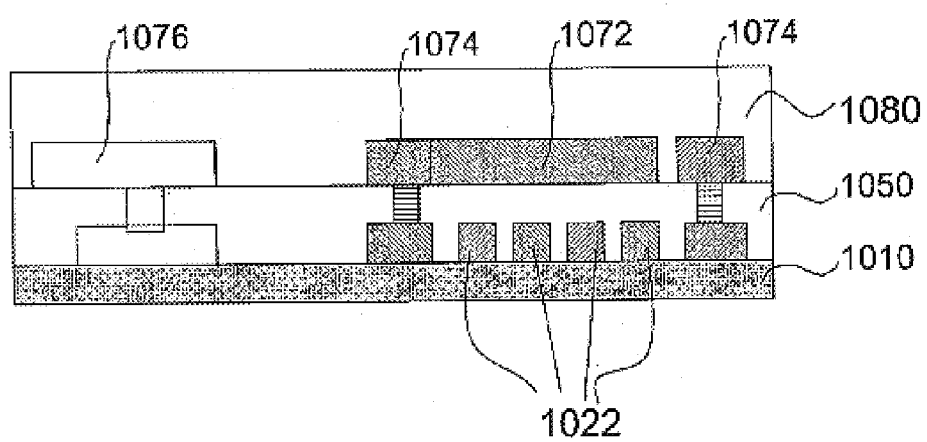

Now turning to FIG. 10G, a second layer of metal is deposited over the dielectric layer 1050. Another layer of photoresist (not shown) is formed on the top of second metal layer. After exposure, development, etching away, and removing the remaining photoresist, the strip 1072 and buses 1074 of the second layer of the interdigitated capacitor and a trench 1076 of other circuit design are formed at the same time. The strip 1072 in FIG. 10G is equivalent to the strip 720 in FIG. 7. It should be noted that strips 1072 of the second layer are oriented approximately perpendicular to strips 1022 of the first layer. A second layer of IMD 1080 is filled between strips and all other vacant area. An additional layer of strips can be formed by repeating the aforementioned steps until the predetermined number of strip layers are achieved.

In addition to the aforementioned method of fabricating an interdigitated capacitor, another method of damascene process can also be used to manufacture an interdigitated capacitor. To increase the operating speed of the integrated circuit while reducing power consumption, conductive material with lower electrical resistance such as copper is used to replace aluminum. However, copper is difficult to etch in a semiconductor environment. As a result, a damascene approach, comprising of etching openings such as trenches and vias in the dielectric material and filling with copper, is used. After a layer of copper seed is deposited onto the surface of dielectric layer where openings for trenches and vias are formed, the bulk of the copper trench-fill and via-fill is often done applying an electroplating technique.

Figure 11:
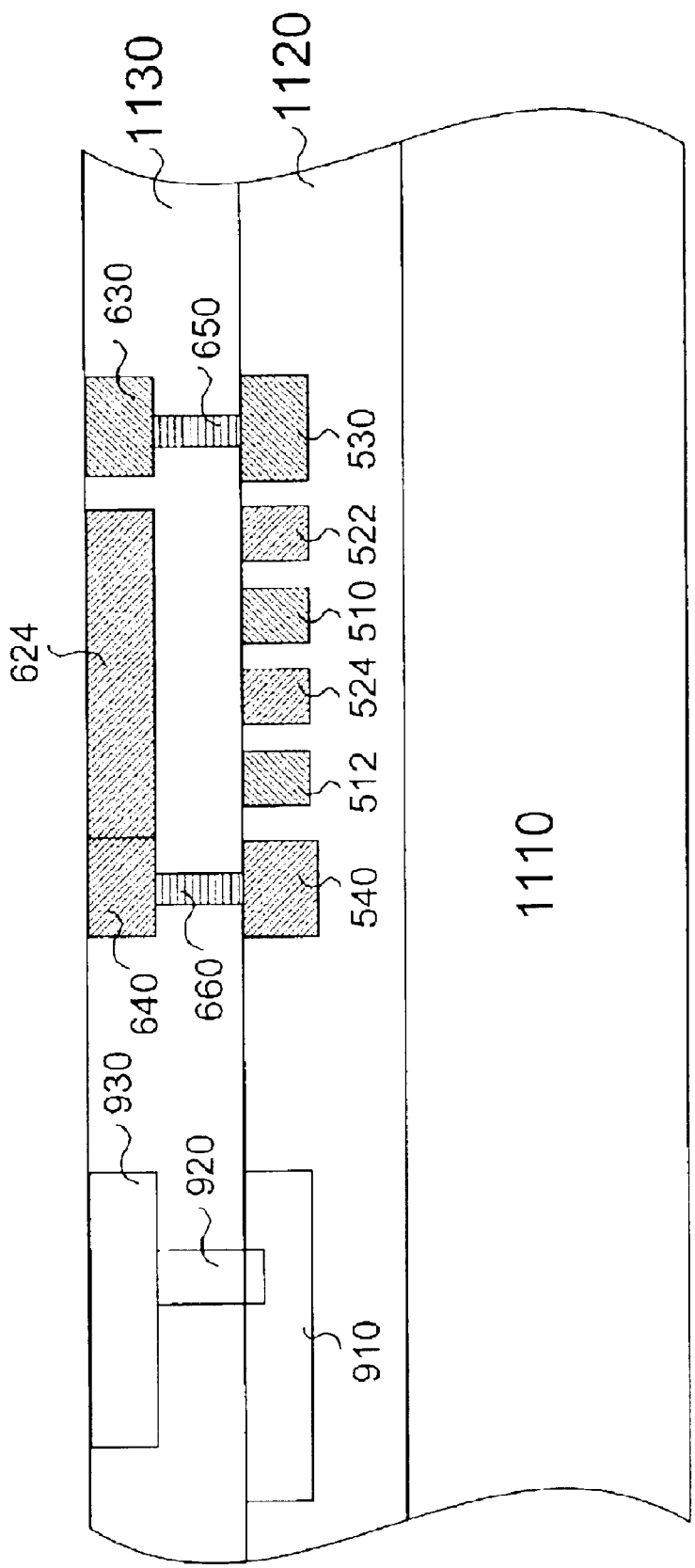
FIG. 11 illustrates a schematic cross-sectional view of an embodiment of the present invention within an integrated circuit manufactured by a damascene process.

As shown in FIG. 11, a dielectric layer 1120 is deposited on the substrate 1110. A layer of photoresist (not shown) is formed on the top of dielectric layer 1120. After photomasking and etching, openings for strips 510, 512, 522, and 524, buses 530 and 540, and other circuit elements, such as a trench 910 are formed. Copper is then deposited to fill these openings by electroplating. The upper surface of the dielectric layer 1120 is then planarized by chemical mechanical polishing. Another layer of dielectric 1130 is deposited over layer 1120. Through dual damascene process, openings for strip 624 and buses 630 and 640 and openings for vias 650 and 660 are formed. Again, copper is deposited to fill these openings by electroplating. The upper surface of the dielectric layer 1130 is planarized by chemical mechanical polishing. An additional layer of strips can be formed by repeating the abovementioned steps until the predetermined number of strip layers are achieved.

While specific embodiments of the present invention are described in details as above, people skilled in the art will appreciate that numerous variations and modifications of these embodiments fall within the scope of the invention as defined in the following claims.

What is claimed is:

1. A method of fabricating a capacitor structure for an integrated circuit, comprising:

forming a first layer of substantially parallel interdigitated strips;

forming a second layer of substantially parallel interdigitated strips overlying said first layer, said strips of said second layer oriented approximately perpendicular to said strips of said first layer;

forming dielectric material between said strips;

connecting alternate ones of said strips of said first layer to a first bus and a second bus;

connecting alternate ones of strips of said second layer to a first bus of said second layer and a second bus of said second layer; and connecting said first bus of said second layer to said first bus of said first layer and said second bus of said second layer to said second bus of said first layer.

2. The method of claim 1 further comprising:

forming at least one additional layer of substantially parallel interdigitated strips overlying said second layer, said strips of each said additional layer oriented approximately perpendicular to strips of a layer underlying said additional layer;

forming dielectric material between said strips;

connecting alternate ones of said strips of each said additional layer to a first bus of each said additional layer and a second bus of each said additional layer; and connecting said first bus of each said additional layer to said first bus of said underlying layer and said second bus of each additional layer to said second bus of said underlying layer.

3. The method of claim 2 further comprising forming said first bus and said second bus respectively in L shape.

4. The method of claim 2 further comprising:

connecting said first bus of each layer to said first bus of said underlying layer by at least one via; and connecting said second bus of each layer to said second bus of said underlying layer by at least one via.

5. A capacitor structure for an integrated circuit comprising:

at least two layers of substantially parallel interdigitated strips, said strips of the same layer alternately connected to a first bus and a second bus, said strips of one layer oriented approximately perpendicular to strips of an adjacent layer;

dielectric material between said strips; and said first bus and said second bus of different layers being respectively interconnected.

6. The device of claim 5 wherein said first bus and said second bus are each in L shape.

7. The device of claim 5 wherein said first bus and said second bus of different layers being respectively interconnected to each other by at least one via.

* * * * *